United States Patent
Ngai et al.

(10) Patent No.: US 6,518,106 B2
(45) Date of Patent: Feb. 11, 2003

(54) SEMICONDUCTOR DEVICE AND A METHOD THEREFOR

(75) Inventors: Tat Ngai, Austin, TX (US); Bich-Yen Nguyen, Austin, TX (US); Vidya S. Kaushik, Austin, TX (US); Jamie K. Schaeffer, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/865,855

(22) Filed: May 26, 2001

(65) Prior Publication Data

US 2002/0175384 A1 Nov. 28, 2002

(51) Int. Cl.[7] .......................... H01L 21/00; H01L 21/84
(52) U.S. Cl. .................... 438/157; 438/176; 438/583; 257/250; 257/331; 257/388; 257/407; 257/412
(58) Field of Search ................................ 438/157, 176, 438/283, 303, 592, 199, 230; 257/250, 331, 365, 366, 388, 407, 412

(56) References Cited

U.S. PATENT DOCUMENTS

| | | | | |
|---|---|---|---|---|
| 4,974,056 A | * | 11/1990 | Brodsky et al. | 257/751 |
| 5,466,958 A | * | 11/1995 | Kakumu | 257/412 |
| 5,589,701 A | * | 12/1996 | Baldi | 257/412 |
| 5,776,823 A | * | 7/1998 | Agnello et al. | 438/592 |
| 5,942,786 A | * | 8/1999 | Sheu et al. | 257/407 |
| 6,028,339 A | * | 2/2000 | Frenette et al. | 257/364 |
| 6,066,533 A | | 5/2000 | Yu | |
| 6,084,279 A | | 7/2000 | Nguyen et al. | 257/412 |
| 6,114,736 A | * | 9/2000 | Balasubramanyam et al. | 257/412 |
| 6,140,688 A | * | 10/2000 | Gardner et al. | 257/412 |
| 6,174,775 B1 | * | 1/2001 | Liaw | 438/283 |
| 6,203,613 B1 | * | 3/2001 | Gates et al. | 117/104 |
| 6,204,103 B1 | | 3/2001 | Bai et al. | |
| 6,261,885 B1 | * | 7/2001 | Cheek et al. | 438/283 |
| 6,281,064 B1 | * | 8/2001 | Mandelman et al. | 438/233 |
| 6,291,282 B1 | | 9/2001 | Wilk et al. | |
| 6,355,561 B1 | * | 3/2002 | Sandhu et al. | 438/676 |
| 6,373,111 B1 | * | 4/2002 | Zheng et al. | 257/407 |
| 6,383,879 B1 | * | 5/2002 | Kizilyalli et al. | 438/303 |
| 2002/0008257 A1 | | 1/2002 | Barnak et al. | |

FOREIGN PATENT DOCUMENTS

| | | |
|---|---|---|
| EP | 0899784 A2 | 3/1999 |
| JP | 60045053 | 3/1985 |
| JP | 2000031291 | 1/2000 |
| JP | 2001196468 | 7/2001 |

OTHER PUBLICATIONS

Lu et al, "Dual–Metal Gate Technology for Deep Submicron CMOS Transistors," IEEE, Symposium on VLSI Technology Digest of Technical Paper, pp. 72–73 (2000).

Maiti et al., "Metal Gates for Advanced CMOS Technology," SPIE Conference on Microelectronic Device Technology III, SPIE vol. 3881, pp. 46–57 (1999).

Clafin et al., "High-K Dielectrics and Dual Metal Gates: Integration Issues for New CMOS Materials," Materials Research Society Symposium Proc. vol. 567, pp. 603–608 (1999).

(List continued on next page.)

*Primary Examiner*—David Nelms
*Assistant Examiner*—Andy Huynh
(74) *Attorney, Agent, or Firm*—Kim-Marie Vo; James L. Clingan, Jr.

(57) ABSTRACT

A semiconductor device with dual gate electrodes and its method of formation is taught. A first metal/silicon gate stack and a first gate dielectric are formed over a first doped region. The metal/gate stack comprises a metal portion over the first gate dielectric and a first gate portion over the metal portion. A silicon gate and a second gate dielectric are formed over the second doped region. In one embodiment, the first and second gate portions are P+ doped silicon germanium and the metal portion is TaSiN. In another embodiment, the first and second gate portions are N+ doped polysilicon and the metal portion is TaSiN.

12 Claims, 2 Drawing Sheets

OTHER PUBLICATIONS

Dae–Gyu Park et al., "Novel Damage–free Direct Metal Gate Process Using Atomic Layer Deposition", 2001 IEEE Symposium on VLSI Technology Digest of Technical Papers, 2 pages.

Huicai Zhong et al., "Properties of Ru–Ta Alloys as Gate Electrodes For NMOS and PMOS Silicon Devices", Dept. of Electrical Engineering, Hankuk Aviation University, Kyungki–do, Korea, email: vmisra@eos.ncsu.edu, pp. 1–3.

* cited by examiner

SEMICONDUCTOR DEVICE AND A METHOD THEREFOR

FIELD OF THE INVENTION

This invention relates, in general, to semiconductor devices and a method for forming thereof, and, more particularly, to semiconductor devices with dual gates and a method for forming thereof.

BACKGROUND OF THE INVENTION

Polysilicon has traditionally been used as the gate electrode for MOS transistors. The polysilicon electrode is typically doped either P+ or N+ to match the doping of the source and drain regions in CMOS technology. As device dimensions shrink, however, problems exist with using polysilicon as a gate electrode. For example, as the dimensions of the P+ doped polysilicon gate electrode decrease, boron can penetrate from the polysilicon gate electrodes through the gate dielectric and decrease the reliability of the device. In addition, as dimensions shrink for both P+ and N+ doped polysilicon, doping concentrations increase. High temperature processes are performed in order to drive the dopants into the gate electrode. Due to scaling, the source and drain are shallower. Disadvantageously, the high temperature process can cause the source and drain to become deeper. If the high temperature is not performed, however, the dopants are more likely to reside away from the gate dielectric. Hence, there will be an area of the gate electrode that is not doped. This polydepletion effect will act as an additional capacitance in series with the gate dielectric capacitance. In other words, it will undesirably increase the effective oxide thickness of the transistor. The polydepletion effect was not a significant effect in older technology, because the thickness of the polydepletion area was small compared to the gate dielectric effective thickness.

One solution is to use a material which has a work function approximately equal to the work function of either P doped or N doped silicon. P doped silicon has a work function of approximately 4.1 eV whereas N doped silicon has a work function of approximately 5.2 eV. The difficulty is to choose a material which is suitable to both these values. Another option is to use two different materials where one would be approximately equal to the work function of N doped silicon and the other approximately equal to the work function of P doped silicon. It is difficult to find two different materials with different work functions that have the chemical and thermo-stability necessary to be incorporated into a CMOS process flow. Therefore a need exists to find gate materials that are suitable for scaled devices.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

The conduction band for silicon lies at 4.1 eV below the vacuum level. The valence band lies approximately 1.1 eV below the conduction band for silicon or at 5.2 eV below the vacuum level. The approximate 1.1 eV difference between the valence and conduction bands of silicon is referred to as the band-gap. The mid-gap is approximately half of the band-gap and is approximately halfway between the conduction and valance bands of the material. A desirable work function for gate electrodes of N channel transistors is one which falls between the conduction band and mid-gap of the semiconductor substrate. A more desirable work function for N channel transistors is additionally at least 0.2 eV from the mid-gap. In other words, the more desirable work function for N channel transistor is between approximately 4.1 and 4.5 eV below vacuum level. A desirable work function for gate electrodes of P channel transistors is one which falls between the valence band and the mid-gap of the semiconductor substrate. A more desirable work function for P channel transistors is additionally at least 0.2 eV from the mid-gap or between approximately 4.9 and 5.2 eV below vacuum level.

Figure 1:
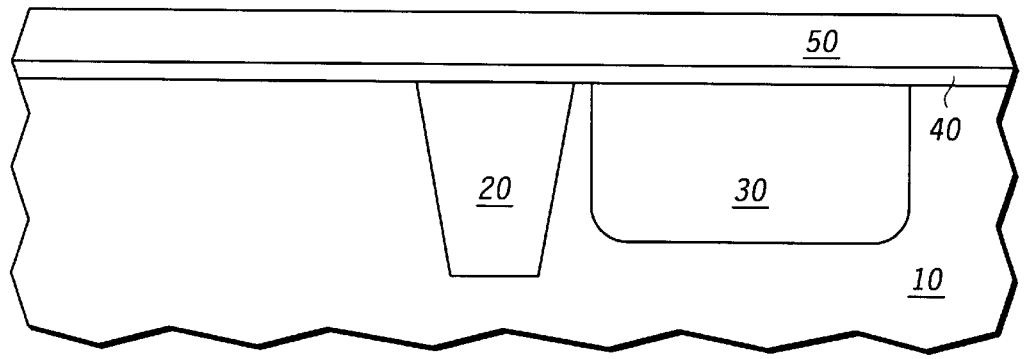
FIG. 1 includes an illustration of a cross-sectional view of a portion of a semiconductor device substrate after forming gate dielectric and metal gate electrode layers.

FIG. 1 illustrates trench 20 within semiconductor substrate 10 to isolate the subsequently formed transistors. In a preferred embodiment, trench 20 is a shallow trench isolation region. Traditional etch and deposition processes for forming trench 20, as known to one skilled in the art are used. Semiconductor substrate 10 can be monocrystalline silicon, silicon germanium, gallium arsenic, silicon on insulator (SOI), or the like. In a first embodiment, semiconductor substrate 10 is P doped silicon. Silicon can be doped P type by doping the silicon with boron. In this embodiment, well 30 is an N doped well. Well 30 can be doped N type by implanting arsenic, phosphorous or the like. Gate dielectric 40 is formed over semiconductor substrate 10. In one embodiment gate dielectric 40 is $SiO_2$. In this embodiment, the gate dielectric 40 is thermally grown to a thickness of approximately 15 to 50 Angstroms. One of ordinary skill in the art realizes as devices shrink the $SiO_2$ thickness may decrease below 15 Angstroms. In an alternate embodiment, gate dielectric 40 can be an oxide, especially a metal oxide, such as $HfO_2$, $ZrO_2$, $Al_2O_3$, $La_2O_3$, combinations thereof, or the like. If gate dielectric 40 is a metal oxide, it will typically be in the thickness of approximately 5–100 Angstroms, or more preferably less than 25 Angstroms. If gate dielectric 40 is a metal oxide, atomic layer deposition (ALD), chemical vapor deposition (CVD), physical vapor deposition (PVD), combinations thereof, or the like can be used for deposition.

Afterwards, metal gate layer 50 is deposited using ALD, CVD, PVD, combinations thereof, or the like. Metal gate layer 50 can be tantalum silicon nitride (TaSiN), platinum, ruthenium oxide, molybdenum nitride, tungsten silicon nitride, tantalum nitride, molybdenum silicon nitride, titanium silicon nitride, and tungsten nitride. Tantalum silicon nitride has been shown to be a suitable material for NMOS devices, and platinum and tungsten nitride for PMOS devices. In the preferred embodiment where metal gate layer 50 is TaSiN, the silicon or nitrogen concentration can be adjusted to change the work function of this material. For example increasing the concentration of silicon will decrease the work function of this material to approximately 4.4 eV. Increasing the concentration of nitrogen is directly proportional to the work function. Thus increasing the nitrogen concentration can result in a work function of approximately 4.8 eV.

Figure 2:
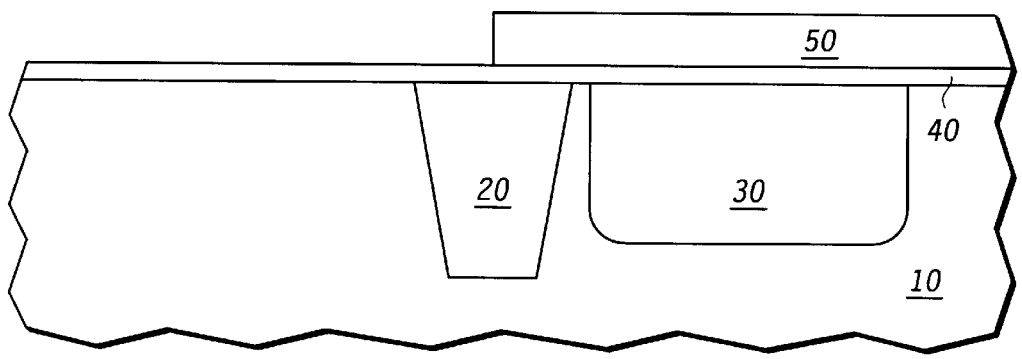
FIG. 2 includes an illustration of a cross-sectional view of a portion of a semiconductor device substrate after patterning the metal gate layer.

Turning to FIG. 2, semiconductor substrate 10 is patterned and metal gate layer 50 is etched. Metal gate layer 50 remains over the portion of semiconductor substrate that contains well 30. Metal gate layer 50 may also remain over a significant portion of trench 20. Etching chemistry similar to those used for etching polysilicon can be used for forming metal gate layer 50. Halogen-based chemistries such as carbon tetrafluoride ($CF_4$), hexafluoroethane ($C_2F_6$), hydrogen bromide (HBr), sulfur hexafluoride ($SF_6$), hydrogen chloride (HCl), molecular chlorine ($Cl_2$), or the like can be used during plasma etching, reactive ion etching, electron cyclotron resonance etching or microwave etching. After metal gate layer 50 has been patterned the photoresist layer is removed using conventional methods, such as exposing the photoresist to an oxygen-containing environment. Metal gate layer 50 is approximately greater than or equal to 50 Angstroms. Typically, the etch is performed using endpoint detection. A timed etched can also be performed.

Figure 3:
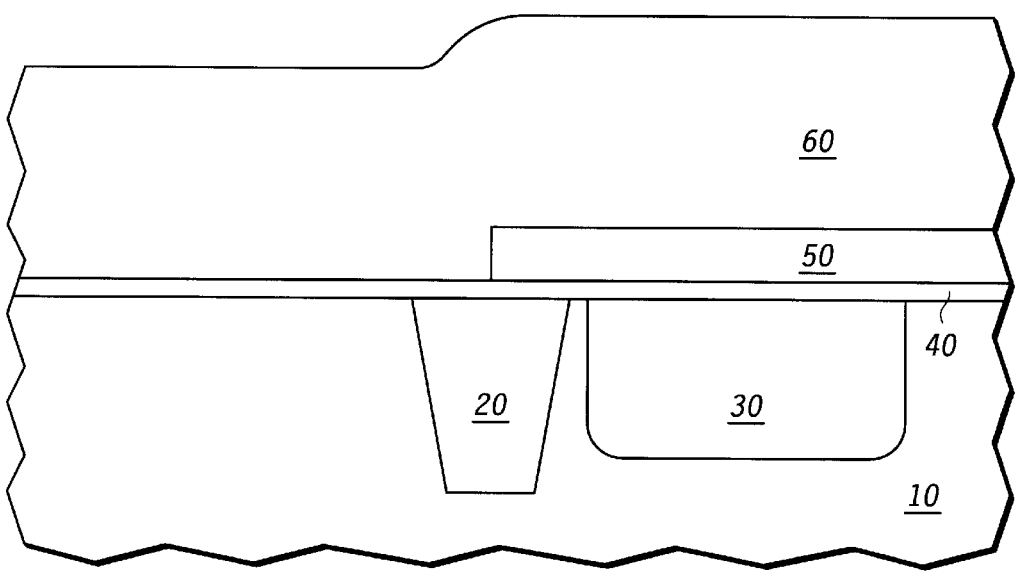
FIG. 3 includes an illustration of a cross-sectional view of the substrate of FIG. 2 after forming a polysilicon layer.

Turning to FIG. 3, second gate electrode 60 is formed. In the first embodiment, second gate electrode 60 is a doped silicon layer. Silicon gate 60 includes deposited amorphous silicon or polysilicon and is doped either in situ or during a separate doping step. In this particular embodiment the thickness of second gate electrode 60 is approximately 1000–2000 Angstroms thick. Optionally, an antireflective coating (ARC) can be formed over doped silicon layer 60.

Figure 4:
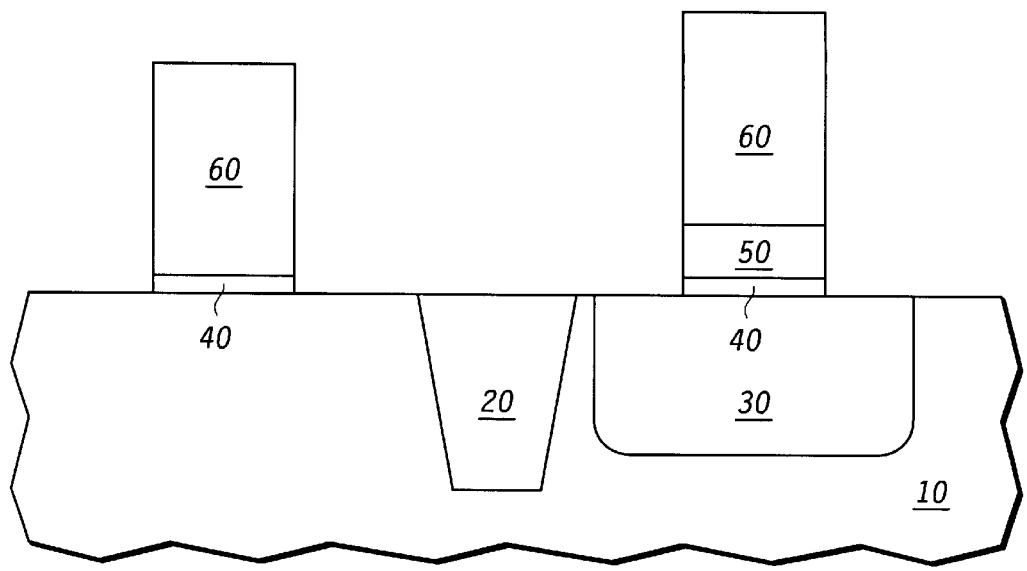
FIG. 4 includes an illustration of a cross-sectional view of the substrate of FIG. 3 after patterning the polysilicon metal gate and gate dielectric layers.

A photoresist layer is deposited over doped silicon layer 60. The same etched chemistries and processes used to previously etch metal gate layer 50 can be used to etch second gate electrode 60 and metal gate layer 50. If gate dielectric 40 is SiO2, a wet etch of dilute HF can be used. Typically the concentration of water to HF is 100:1. If gate dielectric 40 is a metal oxide, HF or phosphoric acid is used. The resulting structure is shown in FIG. 4 with metal gate layer and second gate electrode 60 forming a metal/gate or gate stack. If second gate electrode 60 is silicon then the stack is a metal/silicon gate stack. In one embodiment the metal/silicon gate stack is a tantalum silicon nitride gate portion over a silicon gate portion.

Figure 5:
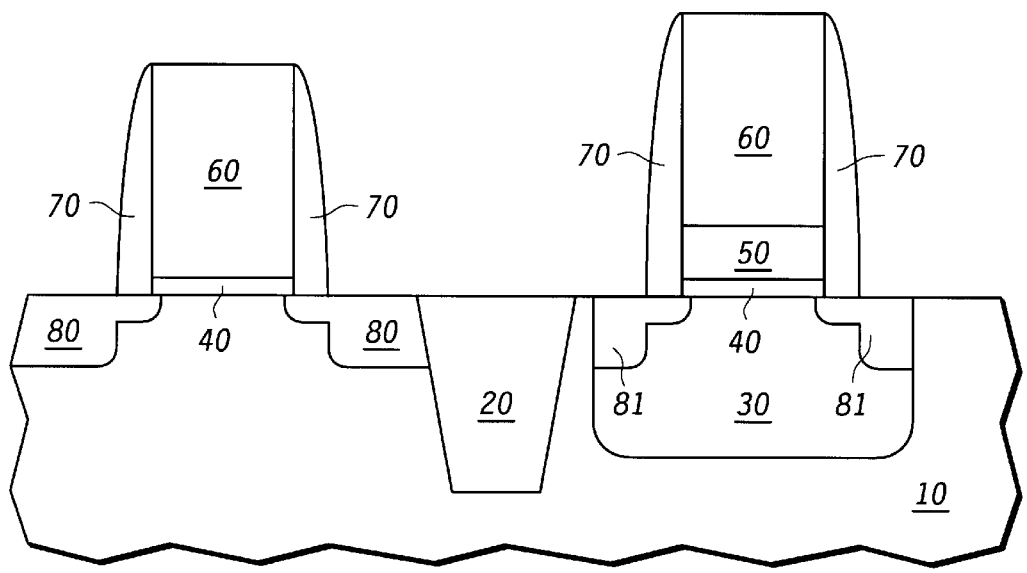
FIG. 5 includes an illustration of a cross-sectional view of the substrate of FIG. 4 after forming a substantially completed device.

Processing continues to form the rest of the semiconductor device as illustrated in FIG. 5. Source and drain 80 are formed during ion implantation. In this first embodiment, source and drain 80 will be N doped, whereas source and drain 81 will be P doped. Spacers 70 are formed surrounding the gate electrodes and gate dielectric. Typically the spacers are formed of nitride. CMOS processing, known to one of ordinary skill in the art, is continued from this point.

Although the first embodiment invention has been described with respect to specific doping types, skilled artisans appreciate that doping types may be reversed. For example, semiconductor substrate 10 can be N doped and well 30 can be P doped. In this case, the silicon electrode will be over the P doped well and the metal/silicon stack electrode will be over the N doped region.

In the second embodiment, a stack consisting of a semiconductor material and a metal will be formed over the P type substrate or a P well, and a semiconductor gate will be formed over an N well. This can be performed by making semiconductor substrate 10 N doped and well 30 P doped. Or if the semiconductor substrate 10 is P type, the metal/silicon stack will be formed over semiconductor substrate 10 and the gate electrode alone will be formed over well 30. In this embodiment the semiconductor electrode is P doped silicon germanium. All etch and formation processing that has been discussed in regards to the first embodiment can be used in the second embodiment.

It is advantageous to use a metal electrode for either an N channel or P channel transistors and a silicon electrode for the other. This allows the reuse of silicon processes and tools that are already established in the semiconductor field. In addition, it eliminates the necessity to find two different materials with good chemical and thermo-stability with desirable work functions for N channel and P channel transistors. Furthermore, one material with the two different work functions is not needed.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of forming a semiconductor device, comprising:

providing a semiconductor substrate having a first doped region and a second doped region;

providing a dielectric over the first doped region and a second doped region;

providing a metal layer over the dielectric, wherein the metal layer comprises tantalum, silicon and nitrogen;

patterning the metal layer to leave a metal portion over at least a portion of the first doped region;

forming a silicon layer over the metal portion and the second doped region; and patterning the silicon layer and the metal portion to leave a silicon gate over the second doped region and a metal/silicon gate stack over the first doped region.

2. The method of claim 1, wherein the silicon layer is in situ doped with one or more of arsenic and phosphorus.

3. The method of claim 2, wherein the second doped region is P doped.

4. The method of claim 1, wherein the silicon layer is in situ doped with germanium.

5. The method of claim 4, wherein the silicon layer is boron doped.

6. The method of claim 4, wherein the second doped region is N doped.

7. The method of claim 1, wherein the semiconductor substrate has a valence band and a conduction band with a mid-gap that is half way therebetween, and the metal layer has a work function that is between the valence band and the mid-gap.

8. The method of claim 1, wherein the semiconductor substrate has a valence band and a conduction band with a mid-gap that is half way therebetween, and the metal layer has work function that is between the valence band and the conduction band and is at least 0.2 eV from the mid-gap.

9. The method of claim 1, wherein the semiconductor substrate has a valence band and a conduction band with a mid-gap that is half way therebetween, and the metal layer has a work function that is between the conduction band and the mid-gap.

10. A method of making a semiconductor device, comprising:
    providing a semiconductor substrate having a first doped region and a second doped region;
    providing a dielectric layer over the first doped region and a second doped region;
    providing a tantalum silicon nitride layer over the dielectric layer;
    patterning the tantalum silicon nitride layer to leave a tantalum silicon nitride portion over at least a portion of the first doped region;
    forming an in situ doped silicon layer over the tantalum silicon nitride portion and the second doped region; and
    patterning the in situ doped silicon layer and the tantalum silicon nitride portion to leave a silicon gate over the second doped region and a gate stack over the first doped region wherein the gate stack comprises a tantalum silicon nitride gate portion over a silicon gate portion.

11. A method for forming a transistor comprising:
    forming an insulating layer;
    forming a portion of the transistor control electrode overlying the insulating layer by atomic layer deposition, wherein the transistor control electrode comprises a first element and a second element and comprising:
    depositing the first element;
    depositing the second element after the first element; and
    one of changing the concentration of the first element while depositing the first element and changing the second element while depositing the second element; and
    choosing one of the first element and the second element to change the concentration based upon a conductivity of a channel of the transistor.

12. The method of claim 11 wherein forming the insulating layer is performed by atomic layer deposition.

* * * * *

UNITED STATES PATENT AND TRADEMARK OFFICE
CERTIFICATE OF CORRECTION

PATENT NO. : 6,518,106 B2
DATED : February 11, 2003
INVENTOR(S) : Tat Ngai et al.

It is certified that error appears in the above-identified patent and that said Letters Patent is hereby corrected as shown below:

<u>Title page,</u>
Item [75], Inventors, change "Jamie" to -- James --

Signed and Sealed this

Eighteenth Day of November, 2003

JAMES E. ROGAN
*Director of the United States Patent and Trademark Office*

UNITED STATES PATENT AND TRADEMARK OFFICE
CERTIFICATE OF CORRECTION

| | | |
|---|---|---|
| PATENT NO. | : 6,518,106 B2 | Page 1 of 1 |
| APPLICATION NO. | : 09/865855 | |
| DATED | : February 11, 2003 | |
| INVENTOR(S) | : Tat Ngai | |

It is certified that error appears in the above-identified patent and that said Letters Patent is hereby corrected as shown below:

In Column 4, Lines 46-47, Claim 1

Change "a second doped region" to --the second doped region--

In Column 5, Line 21, Claim 10

Change "a second doped region" to --the second doped region--

Signed and Sealed this

Third Day of October, 2006

JON W. DUDAS
*Director of the United States Patent and Trademark Office*